United States Patent
Tillotson

(10) Patent No.: US 11,320,476 B2
(45) Date of Patent: May 3, 2022

(54) EDDY CURRENT SYSTEM FOR USE WITH ELECTRICALLY-INSULATIVE STRUCTURES AND METHODS FOR INDUCTIVELY HEATING OR INDUCTIVELY INSPECTING

(71) Applicant: The Boeing Company, Chicago, IL (US)

(72) Inventor: Brian Jay Tillotson, Seattle, WA (US)

(73) Assignee: The Boeing Company, Chicago, IL (US)

( * ) Notice: Subject to any disclaimer, the term of this patent is extended or adjusted under 35 U.S.C. 154(b) by 398 days.

(21) Appl. No.: 16/512,134

(22) Filed: Jul. 15, 2019

(65) Prior Publication Data

US 2021/0018556 A1 Jan. 21, 2021

(51) Int. Cl.
```
G01R 31/20        (2006.01)
G01R 31/12        (2020.01)
H05H 7/00         (2006.01)
G01R 31/50        (2020.01)
```

(52) U.S. Cl.
CPC ......... *G01R 31/20* (2013.01); *G01R 31/1218* (2013.01); *G01R 31/50* (2020.01); *H05H 7/001* (2013.01); *H05H 2007/002* (2013.01)

(58) Field of Classification Search
None
See application file for complete search history.

(56) References Cited

U.S. PATENT DOCUMENTS

| | | | | |
|---|---|---|---|---|
| 5,132,544 A * | 7/1992 | Glavish | ................ | H01J 37/147 250/492.2 |
| 5,481,116 A * | 1/1996 | Glavish | ............... | H01J 37/1475 250/492.21 |
| 5,672,879 A * | 9/1997 | Glavish | ............... | H01J 37/1475 250/492.21 |
| 7,888,660 B2 * | 2/2011 | Purser | .................. | H01J 37/147 250/492.21 |
| 9,728,371 B2 * | 8/2017 | Glavish | ............... | H01J 37/1475 |
| 11,114,270 B2 * | 9/2021 | Vanderberg | ......... | H01J 37/1475 |
| 11,143,628 B2 * | 10/2021 | Tillotson | ............ | G01N 29/2431 |
| 2008/0067436 A1 * | 3/2008 | Vanderberg | ........... | H01J 37/026 250/492.21 |
| 2009/0283702 A1 * | 11/2009 | Umezawa | ................ | H05H 7/10 250/492.3 |
| 2021/0018971 A1 * | 1/2021 | Rotem | .................. | G06F 9/4881 |

* cited by examiner

*Primary Examiner* — Jermele M Hollington
(74) *Attorney, Agent, or Firm* — Yee & Associates, P.C.

(57) ABSTRACT

An eddy current system and methods of performing operations on a structure using the eddy current system are presented. The eddy current system comprises an ion beam source and a magnetic field source with at least one of variable output intensity or variable output orientation.

20 Claims, 8 Drawing Sheets

EDDY CURRENT SYSTEM FOR USE WITH ELECTRICALLY-INSULATIVE STRUCTURES AND METHODS FOR INDUCTIVELY HEATING OR INDUCTIVELY INSPECTING

BACKGROUND INFORMATION

1. Field

The present disclosure relates generally to electrically-insulative structures and more specifically to methods of locally heating or non-destructively inspecting an electrically-insulative structure.

2. Background

Non-destructive inspection is used to identify inconsistencies within structures. Different forms of non-destructive inspection are advantageous depending upon the type of inconsistencies, material of the structure, size and shape of the structure, and other features of the structure. Inspection of some types of inconsistencies is undesirably difficult using conventional non-destructive inspection methods. For example, micro-cracks, voids, or inconsistencies at internal joints may be undesirably difficult to detect using conventional methods.

Therefore, it would be desirable to have a method and apparatus that takes into account at least some of the issues discussed above, as well as other possible issues.

SUMMARY

An illustrative embodiment of the present disclosure provides a method of inductively inspecting a structure formed of an electrically-insulative material. An ion beam is sent, by an ion beam source, into the structure to form a conductive region in the structure at a depth corresponding to a Bragg peak of the ion beam. A magnetic field is applied from a magnetic field source to the conductive region. At least one magnetic attribute indicative of eddy currents within the structure is sensed by a magnetic sensor.

Another illustrative embodiment of the present disclosure provides a method of inductively heating a volume of an electrically-insulative structure. An ion beam is sent, by an ion beam source, into the structure to form a conductive region in a volume of the structure at a depth corresponding to a Bragg peak of the ion beam. A magnetic field is applied from a magnetic field source to the conductive region to inductively heat the volume of the structure.

Yet another illustrative embodiment of the present disclosure provides an eddy current system. The eddy current system comprises an ion beam source and a magnetic field source with at least one of variable output intensity or variable output orientation.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

Figure 1:
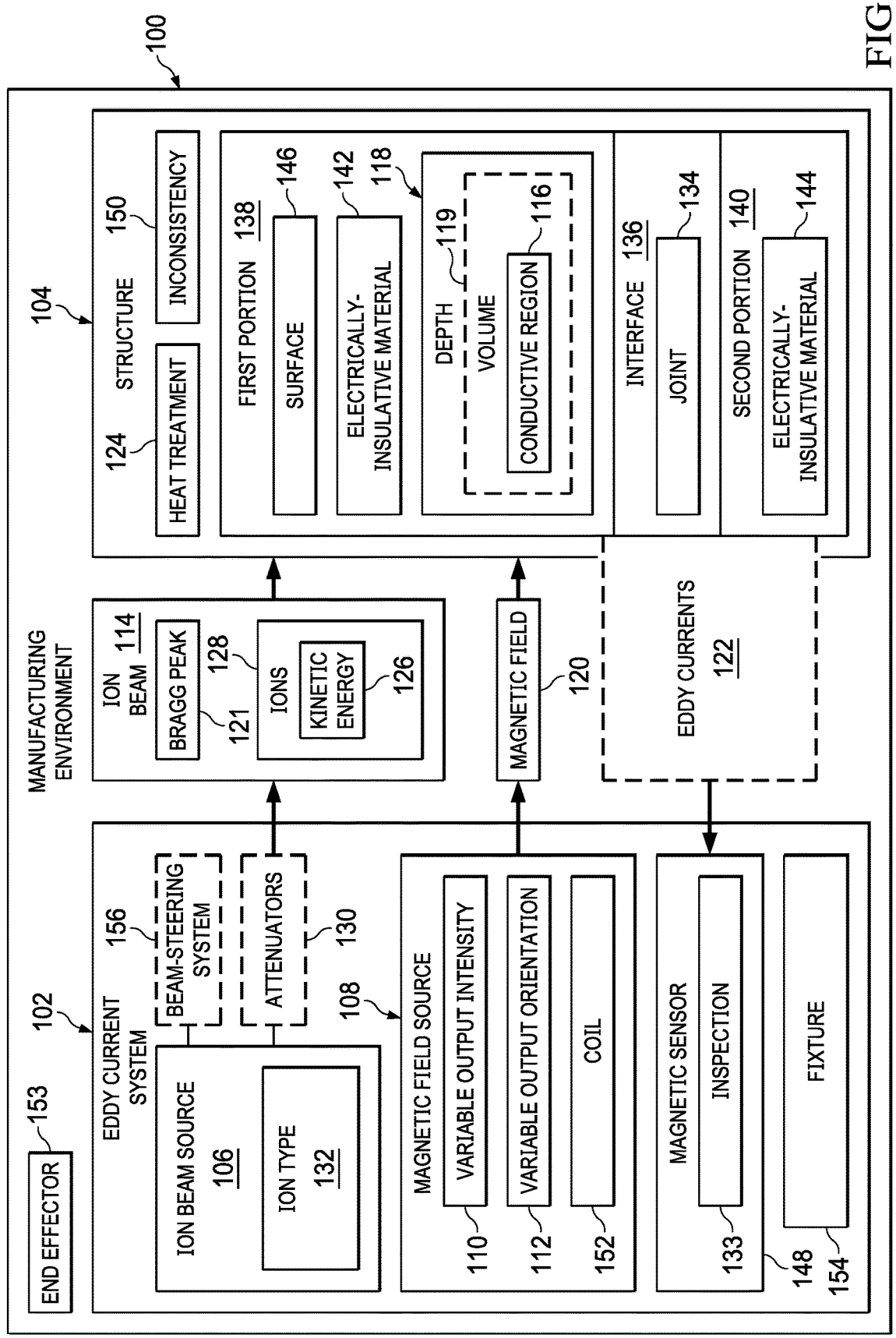
FIG. 1 is an illustration of a block diagram of a manufacturing environment in which an eddy current system operates in accordance with an illustrative embodiment.

The illustrative examples recognize and take into account one or more different considerations. The illustrative examples recognize and take into account that inductive heating is one method of performing heat treatments or welding for structures. Induction heating may be used to perform one of welding, brazing, or annealing of a material rapidly and efficiently. For insulating materials, eddy current testing is not available. The illustrative examples recognize and take into account that to inductively heat a structure formed of electrically-insulative materials, susceptors are placed in the structure.

The illustrative examples recognize and take into account that susceptors add cost and weight to the structure. The illustrative examples also recognize and take into account that the susceptors may undesirably affect structural or aesthetic properties of the structure.

The illustrative examples also recognize and take into account that susceptors are applied during fabrication or assembly of the structure. The illustrative examples recognize that susceptors cannot be added into a structure in the field to enable internal repairs.

The illustrative embodiments recognize and take into about that there are many types of non-destructive inspection methods. The illustrative embodiments recognize and take into account that eddy current technology is a desirable method for finding some types of inconsistencies, such as fine surface cracks, voids, or inclusions. Eddy current technology has a more accurate detection for some types of inconsistencies than other non-destructive inspection methods.

The illustrative examples recognize and take into account that eddy currents can be used for sensing or for heating, but they cannot be used directly in electrical insulators like ceramics, glass, or plastic. The illustrative examples recognize and take into account that it would be desirable to find a method of using eddy currents in electrically-insulative materials.

The illustrative embodiments use a mono-energetic ion beam to create and precisely position a temporary region of high conductivity inside an insulating object, then induce eddy currents for sensing or heating while the volume is conductive. The illustrative embodiments recognize and take into account that a mono-energetic beam of ions, for example protons, passes through material and deposits most of its energy as electron/hole pairs at a specific depth called the Bragg peak. The illustrative embodiments utilize a burst of ions to create a volume with many free electrons in a small volume inside an object. The illustrative embodiments then apply an AC magnetic field before the electrons recombine to induce an electric current. The current may be used for sensing, or to apply more heat than the ion pulse itself can deliver.

The illustrative examples create conductive regions inside a structure by sending ion beams into the structure. The conductive regions are used to induce eddy currents in the structure for sensing or heating. Magnetic fields applied to the conductive regions induce the eddy currents.

Turning now to FIG. 1, an illustration of a block diagram of a manufacturing environment in which an eddy current system operates is depicted in accordance with an illustrative embodiment. Manufacturing environment 100 includes eddy current system 102 to perform at least one of inspection or heating of structure 104. Eddy current system 102 includes ion beam source 106 and magnetic field source 108 with at least one of variable output intensity 110 or variable output orientation 112.

When eddy current system 102 is used to heat structure 104, ion beam source 106 sends ion beam 114 into structure 104 to form conductive region 116 at depth 118 of structure 104. Ion beam 114 is sent, by ion beam source 106, into structure 104 to form conductive region 116 in volume 119 of structure 104 at depth 118 corresponding to Bragg peak 121 of ion beam 114.

Magnetic field source 108 sends magnetic field 120 into conductive region 116 in structure 104. Applying magnetic field 120 to conductive region 116 generates eddy currents 122 in structure 104.

In some illustrative examples, eddy current system 102 heats structure 104 to perform heat treatment 124 on structure 104. Eddy current system 102 can apply heat treatment 124 to a surface of structure 104 or within structure 104. Application of heat treatment 124 is controlled by controlling depth 118.

Depth 118 is controlled by controlling kinetic energy 126 of ions 128 of ion beam 114. Ion beam source 106 takes any desirable form. In some illustrative examples, ion beam source 106 is one of a cyclotron, a van de Graff generator, or a linear accelerator.

In some illustrative examples, depth 118 is controlled using attenuators 130. In some illustrative examples, attenuators 130 are positioned between ion beam source 106 and a target of ion beam source 106. As depicted, structure 104 is the target of ion beam source 106. Attenuators 130 are optional. When present, attenuators 130 control kinetic energy 126 of ions 128 of ion beam 114. Controlling kinetic energy 126 of ions 128 of ion beam 114 adjusts depth 118 of conductive region 116 in structure 104.

In some illustrative examples, kinetic energy 126 of ions 128 of ion beam 114 is controlled by adjusting ion beam source 106. In some illustrative examples, ion beam source 106 is adjusted by changing ion type 132.

In some illustrative examples, ion beam source 106 is configured to emit different kinds of ions, for example hydrogen, deuterium, helium (alpha particles), carbon, or heavier nuclei. Different kinds of ions have sharper or less sharp Bragg peaks and penetrate to different distances for the same energy. Also, different kinds of ions produce different long-term effects in structure 104. For example, hydrogen or helium diffuse through many types of material and escape structure 104. Carbon and heavier ions stay where they stop, so they may be chosen to introduce beneficial properties (or minimally detrimental properties) into the material.

Depth 118 is selected based upon a desired operation to be performed on structure 104. Eddy current system 102 may be used to perform inspection 133, heat treatment 124, or to form joint 134.

In some illustrative examples, eddy current system 102 is used to form joint 134 in structure 104. Joint 134 is formed at interface 136 between first portion 138 and second portion 140. First portion 138 is formed of electrically-insulative material 142. Second portion 140 is formed of electrically-insulative material 144.

Electrically-insulative material 142 and electrically-insulative material 144 take any desirable form. In some illustrative examples, electrically-insulative material 142 and electrically-insulative material 144 are the same. In some illustrative examples, electrically-insulative material 142 and electrically-insulative material 144 are different materials. In some illustrative examples, each of electrically-insulative material 142 and electrically-insulative material 144 is selected from at least one of glass, ceramics, adhesives, or composite materials.

To form joint 134, material of at least one of first portion 138 or second portion 140 near interface 136 is heated. Depth 118 is selected to heat material of at least one of first portion 138 or second portion 140. As depicted, depth 118 is within first portion 138. In some illustrative examples, depth 118 is within second portion 140. In some illustrative examples, depth 118 is at interface 136.

To heat structure 104, ion beam source 106 sends ion beam 114 into structure 104. Ion beam 114 is sent, by ion beam source 106, into surface 146 of structure 104. Ion beam 114 forms conductive region 116 in structure 104 at depth 118 corresponding to Bragg peak 121 of ion beam 114. Heat is generated in volume 119 due to ions 128 depositing energy in volume 119. Additional heat is generated by magnetic field 120. Magnetic field 120 is applied from magnetic field source 108 to conductive region 116 to inductively heat volume 119 of structure 104.

In some embodiments, ion beam source 106 fires a single shot per location on surface 146 of structure 104. Performing an operation, such as inspection 133, heat treatment 124, or joining, by applying a single shot per location offers the fastest performance of the respective operation.

In some illustrative examples, ion beam source 106 fires repeated pulses to a location on surface 146. Firing repeated pulses offers more gradual heating and allows time for multiple sensor samples. In some illustrative examples, the multiple sensor samples occur between beam pulses, so the magnetic field does not disturb the ion beam. Multiple sensor samples can improve sensitivity of inspection 133.

In some illustrative examples, ion beams are repeatedly sent into structure 104 until volume 119 is heated to a desired temperature for joining first portion 138 and second portion 140. In some illustrative examples, ion beams are repeatedly sent into structure 104 at varying depths to heat edges of first portion 138 and second portion 140 on either side of interface 136.

Some illustrative examples "chirp" the ion energy. For example, some illustrative examples shift the ion energy slightly lower or higher over a quick sequence of pulses. Shifting the ion energy shifts the location of the small volume over a short distance, for example a millimeter or so. In some illustrative examples, shifting the location of the small volume over a short distance includes shifting the volume from one side of joint 134 to the other. In these illustrative examples, when the magnetic field creates eddy currents, adjacent currents on both sides of joint 134 flow in the same direction. Due to Ampere's Force Law, an attractive force results that pulls the two sides of joint 134 together, helping to provide a desirable bond.

In some illustrative examples, heat treatment 124 is performed on structure 104. Heat treatment 124 is performed on structure 104 by inductively heating volume 119 to a desired temperature. Heat treatment 124 is performed on any desirable area of structure 104.

In some illustrative examples, eddy current system 102 is used to perform inspection 133 on structure 104. In these illustrative examples, eddy current system 102 also includes magnetic sensor 148. Magnetic sensor 148 is configured to sense at least one magnetic attribute indicative of eddy currents 122 within structure 104.

If eddy current system 102 is used in a sensing application, magnetic sensor 148 measures changes in magnetic field 120. The measurement is sometimes indirect, such as a change in phase or frequency of the field source. If the change in magnetic field 120 is weaker than it would be for a structure of the same type having a desired quality, this is evidence of inconsistency 150. For example, if the change in magnetic field 120 is weaker than it would be for a structure of the same type having a desired quality, this is evidence of a crack, voids, missed tow, a gap, or an unbonded area that blocks eddy currents 122. Varying kinetic energy 126 of ions 128 allows the conductive region 116 to be created at selected depths.

Magnetic sensor 148 is positioned at any desirable location relative to structure 104. In some illustrative examples, magnetic sensor 148 is positioned as close as possible to conductive region 116.

In some illustrative examples, magnetic sensor 148 is positioned relative to a same surface of structure as magnetic field source 108. In some illustrative examples, magnetic field source 108 includes coil 152. In some illustrative examples when coil 152 is hollow, magnetic sensor 148 is positioned within a center of coil 152 of magnetic field source 108. In some illustrative examples, positioning magnetic sensor 148 within a center of coil 152 will position magnetic sensor 148 as close as possible to conductive region 116.

In some illustrative examples, each component of eddy current system 102 could be on a single aperture. In some illustrative examples, at least one of ion beam source 106, magnetic field source 108, or magnetic sensor 148 are connected to end effector 153.

In some illustrative examples, ion beam source 106 and magnetic field source 108 are directed in a same direction. In these illustrative examples, when ion beam source 106 and magnetic field source 108 are directed in a same direction, ion beam 114 and magnetic field 120 are sent into the same surface.

In some illustrative examples, eddy current system 102 also includes fixture 154. Fixture 154 is configured to position structure 104 relative to ion beam 114. In some illustrative examples, fixture 154 is configured to place structure 104 into tension. In some embodiments, fixture 154 stretches structure 104 in a way that places a joint 134 under tension. Placing joint 134 under tension widens unbonded spots at interface 136, so that eddy current system 102 more easily distinguishes an unbonded joint.

In some illustrative examples, fixture 154 is computer-controlled. In some illustrative examples, fixture 154 will move structure 104 relative to eddy current system 102. In some illustrative examples, eddy current system 102 will move relative to structure 104.

In some illustrative examples, fixture 154 repeatedly moves structure 104 so ion beam 114 deposits its energy at different locations in a user-selected pattern. Data collected from different patterns allows three-dimensional analysis of the object's interior, or more sensitive testing of many locations along joint 134. Heating at different locations in the pattern allows joining or heat-treating a complex shape.

In some illustrative examples, eddy current system 102 includes beam-steering system 156 configured to change a shape of ion beam 114. In some illustrative examples, beam-steering system 156 is optional.

Varying kinetic energy 126 of ions 128 allows conductive region 116 to be created at selected depths. Steering ion beam 114 with beam-steering system 156 allows conductive region 116 to be created in specified patterns, even intricate ones. Beam-steering system 156 takes any desirable form. In some illustrative examples, beam-steering system 156 comprises electrostatic deflectors, as in a common CRT. A non-limiting example of beam-steering system 156 is the x-y electrostatic beam steering used in cathode ray tubes.

In some embodiments, beam-steering system 156 is installed between ion beam source 106 and structure 104. When present, beam-steering system 156 bends the ion paths. Rather than a single narrow path resulting in a single small conductive volume, beam-steering system 156 can create wider conductive volumes or conductive volumes in selected patterns. For a rework, these patterns might include the circumference of a newly-installed patch, or a relatively large conductive circle to capture magnetic flux and channel the resulting eddy currents to a narrow zone that heats rapidly. Beam-steering system 156 could controlled by either a computer or by analog inputs.

The illustration of manufacturing environment 100 in FIG. 1 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, although ion beam 114 is depicted, ion beam source 106 sends a plurality of ion beams into structure 104. As another example, although structure 104 is depicted as having first portion 138 and second portion 140, structure 104 has any desirable quantity of portions. In some illustrative examples, structure 104 has only one portion and joint 134 isn't present. In other illustrative examples, structure 104 has more than two portions.

In some illustrative examples, at least one of electrically-insulative material 142 or electrically-insulative material 144 is anisotropic. When a nominally anisotropic region is stimulated, it will have an anisotropic pattern of conductivity. If layers of an anisotropic material are misaligned, eddy currents 122 will be different than for aligned layers of an anisotropic material. To detect misaligned layers of a material, multiple magnetic sources may be positioned relative to structure 104. In these illustrative examples, each of the multiple magnetic sources will be oriented differently. When eddy current system 102 includes a plurality of magnetic sources, fiber misalignment including wrinkles, cross-overs, or any other type of alignment differences can be detected using eddy current system 102.

Figure 2:
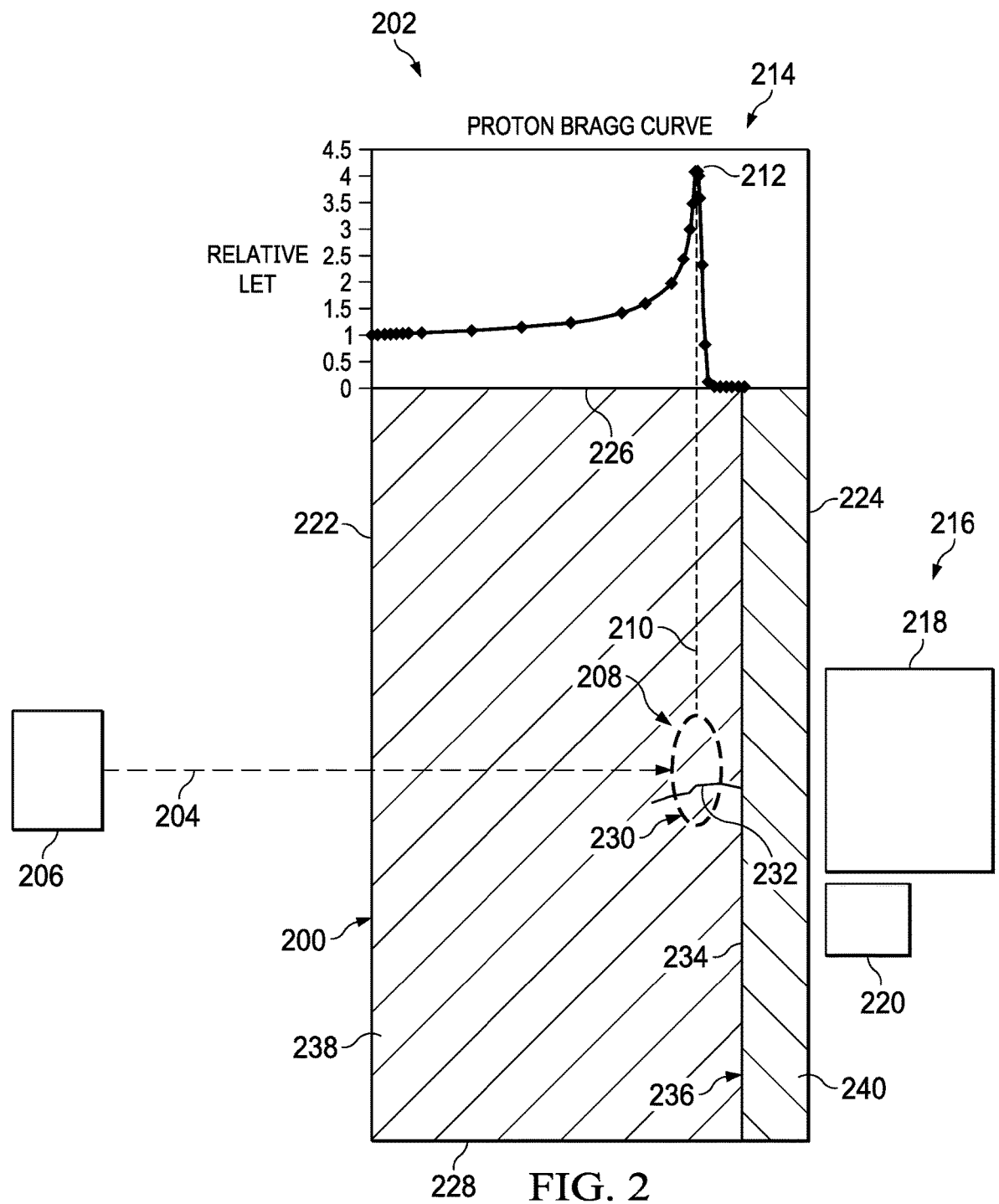
FIG. 2 is an illustration of a cross-sectional view of a structure during inspection in accordance with an illustrative embodiment.

Turning now to FIG. 2, an illustration of a cross-sectional view of a structure during inspection is depicted in accordance with an illustrative embodiment. Structure 200 is present in manufacturing environment 202. Structure 200 is formed of an electrically-insulative material. Structure 200 is a physical implementation of structure 104 of FIG. 1.

Ion beam 204 is sent by ion beam source 206 into structure 200. By sending ion beam 204 into structure 200, conductive region 208 is formed in structure 200 at depth 210. Depth 210 corresponds to Bragg peak 212 of ion beam 204.

Graph 214 with Bragg peak 212 is presented to demonstrate the energy loss of ion beam 204 as it travels through structure 200. Bragg peak 212 occurs immediately prior to ions of ion beam 204 coming to rest. Bragg peak 212 occurs immediately prior to depth 210.

A kinetic energy of the ions in ion beam 204 is controlled to adjust depth 210 of conductive region 208. The kinetic energy is controlled by adjusting ion beam source 206 or inserting attenuators (not depicted) between ion beam source 206 and structure 200.

Eddy current system 216 includes ion beam source 206, magnetic field source 218, and magnetic sensor 220. Eddy current system 216 is a physical implementation of eddy current system 102 of FIG. 1. Components of eddy current system 216 can be positioned in any desirable location relative to structure 200. As depicted, ion beam 204 is sent into first surface 222 of structure 200. As depicted, magnetic field source 218 and magnetic sensor 220 are positioned relative to second surface 224 of structure 200. In some other non-depicted examples, ion beam source 206, magnetic field source 218, and magnetic sensor 220 are associated with a same surface. In some illustrative examples, each of ion beam source 206, magnetic field source 218, and magnetic sensor 220 are associated with a different surface of structure 200.

As depicted, first surface 222 and second surface 224 are substantially parallel to each other. However, in some illustrative examples, ion beam source 206 and at least one of magnetic field source 218 and magnetic sensor 220 are associated with surfaces that are not parallel to each other.

For example, at least one of magnetic field source 218 or magnetic sensor 220 may be positioned relative to third surface 226. In some illustrative examples, at least one of magnetic field source 218 or magnetic sensor 220 may be positioned relative to fourth surface 228.

Ion beam source 206 fires a pulse of mono-energetic ions, ion beam 204. Ion beam 204 enters structure 200 and deposits most of its energy at depth 210. This energy creates a large population of electron-hole pairs in a small volume, volume 230.

While electron-hole pairs are present in volume 230 at depth 210, magnetic field source 218 applies a varying magnetic field (not depicted). The varying magnetic field induces an eddy current (not depicted) in volume 230.

The eddy current causes Joule heating and a change in the magnetic field. Magnetic sensor 220 senses changes in the magnetic field. Magnetic sensor 220 senses at least one magnetic attribute indicative of eddy currents within structure 200. In some illustrative examples, magnetic sensor 220 measures a change in phase or frequency of the magnetic field.

When a change in the magnetic field is weaker than expected, this is indicative of an inconsistency. An inconsistency, such as cracks, voids, or unbonded areas would block eddy currents. As a result, an inconsistency, such as a crack, a void, or an unbonded area would cause a weaker than expected change in the magnetic field.

As depicted, inconsistency 232 is present in structure 200. Inconsistency 232 is identified using eddy current system 216. As depicted, conductive region 208 includes inconsistency 232. Magnetic attributes received by magnetic sensor 220 from a magnetic field applied to conductive region 208 identify inconsistency 232.

The illustration of manufacturing environment 202 in FIG. 2 is not meant to imply physical or architectural limitations to the manner in which an illustrative embodiment may be implemented. Other components in addition to or in place of the ones illustrated may be used. Some components may be unnecessary.

For example, structure 200 is depicted as having joint 234 formed at intersection 236 between first portion 238 and second portion 240. In some illustrative examples, structure 200 is formed of more than two portions. In some illustrative examples, structure 200 is formed of only one portion.

As another example, although ion beam 204 is depicted as entering structure 200 perpendicular to first surface 222, ion beam 204 may enter structure 200 at any desirable angle. Ion beam 204 may enter structure 200 with any desirable shape. Ion beam 204 may enter structure 200 through any desirable surface of structure 200.

Figure 3:
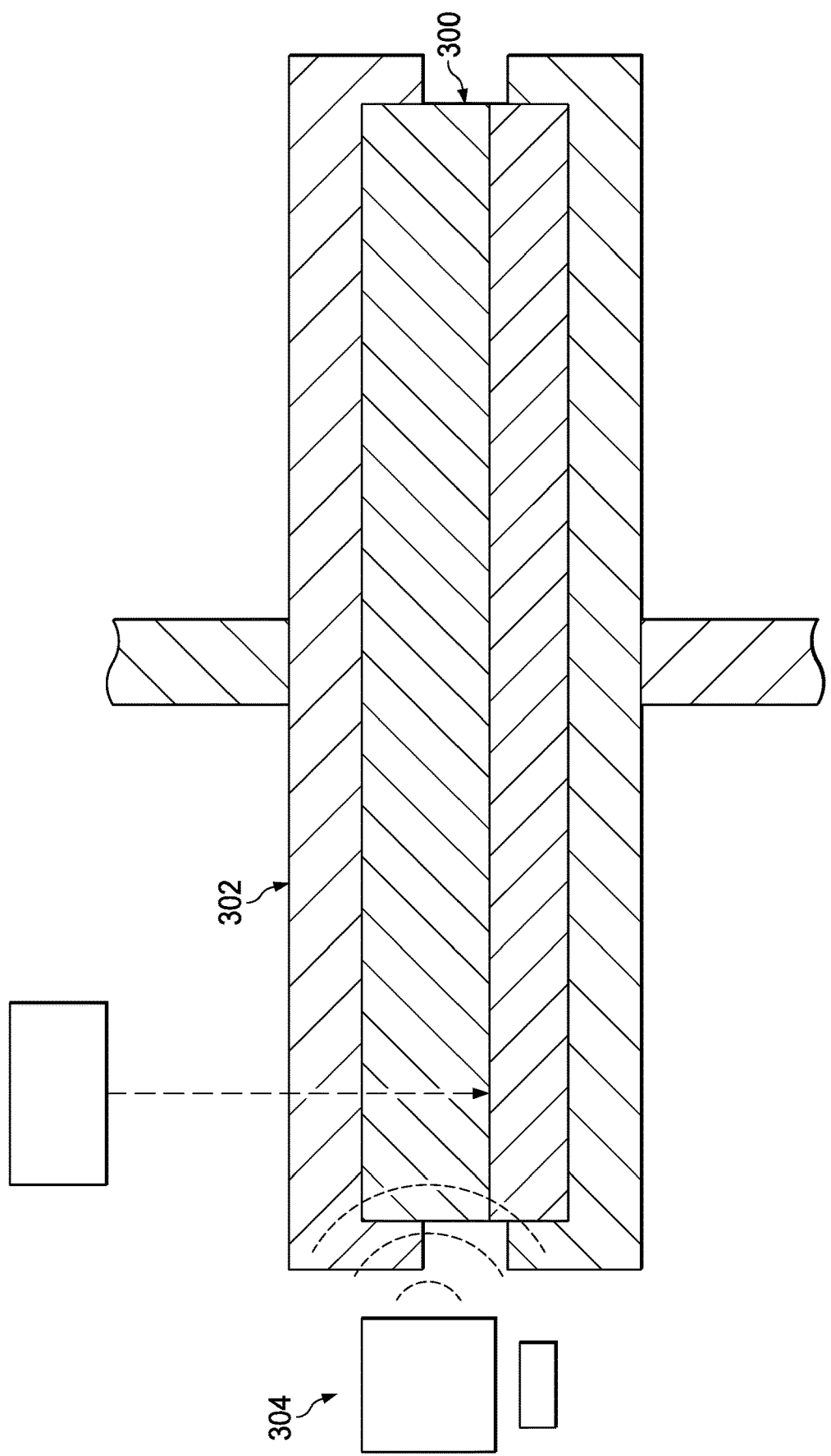
FIG. 3 is an illustration of a cross-sectional view of a structure positioned within a fixture for inspection in accordance with an illustrative embodiment.

Turning now to FIG. 3, an illustration of a cross-sectional view of a structure positioned within a fixture for inspection is depicted in accordance with an illustrative embodiment. As depicted, structure 300 is held by fixture 302. In some illustrative examples, fixture 302 places structure 300 under tension. By placing structure 300 under tension, a joint within structure 300 is placed under tension. By placing the joint under tension, any unbonded spots at the joint will widen. By placing structure 300 under tension, eddy current system 304 may more easily identify unbonded sections of a joint in structure 300.

In some illustrative examples, fixture 302 is configured to hold structure 300 in the ion beam. In some illustrative examples, fixture 302 may also hold attenuators to control the energy of ions entering structure 300.

To perform an operation on structure 300, structure 300 is placed in fixture 302. Structure 300 is oriented so a desired part of structure 300 is in the beam path.

In some illustrative examples, fixture 302 will move structure 300 relative to eddy current system 304. In some illustrative examples, eddy current system 304 will move relative to structure 300.

Figure 4:
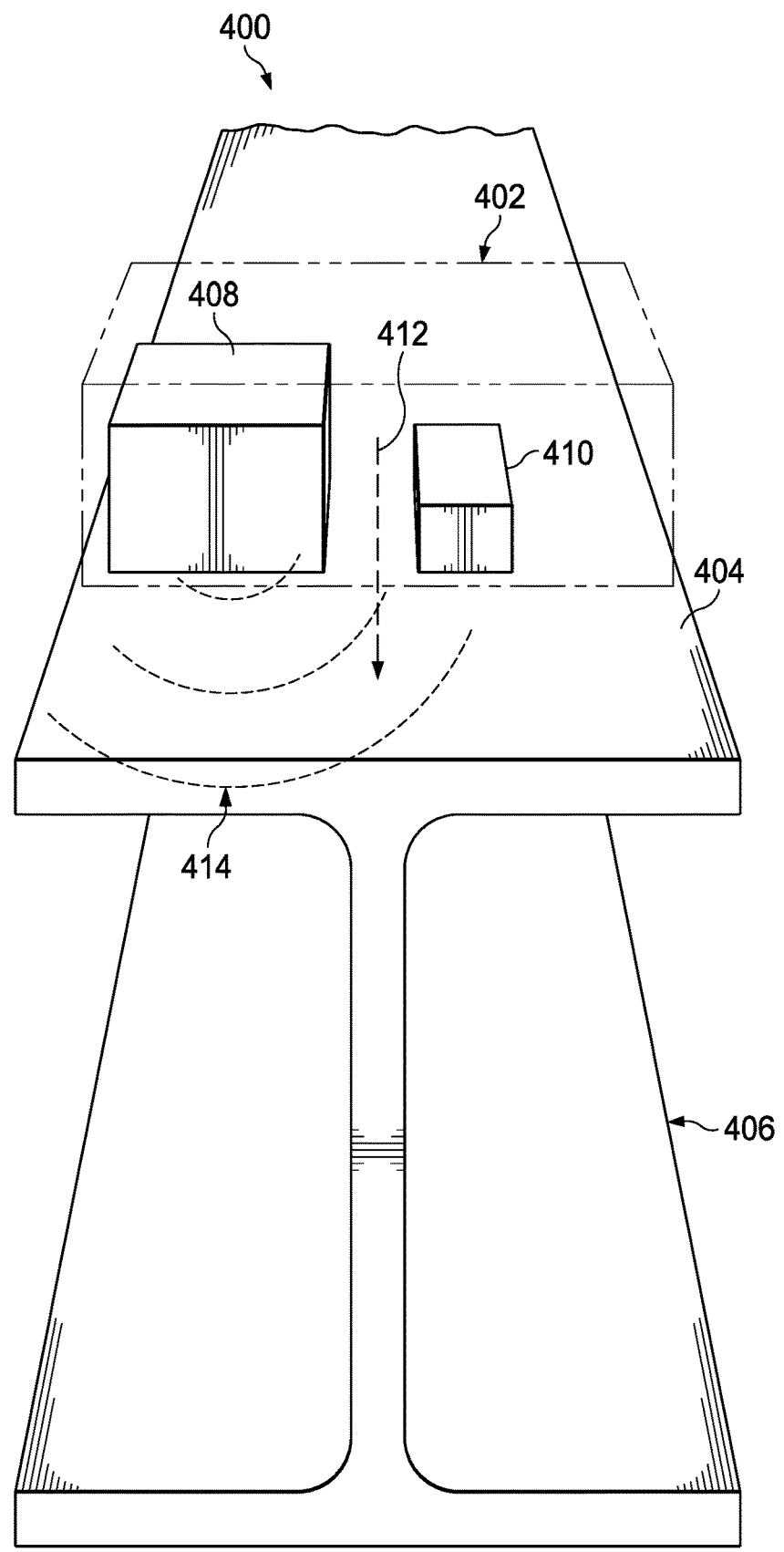
FIG. 4 is an illustration of a perspective view of a structure and an eddy current system in accordance with an illustrative embodiment.

Turning now to FIG. 4, an illustration of a perspective view of a structure and an eddy current system is depicted in accordance with an illustrative embodiment. In view 400, eddy current system 402 is positioned relative to first surface 404 of structure 406. Eddy current system 402 is a physical implementation of eddy current system 102 of FIG. 1.

In some illustrative examples, surfaces other than first surface 404 may be undesirably difficult to access for non-destructive inspection. Surfaces other than first surface 404 may be undesirably difficult to access for non-destructive inspection due to a design of structure 406. As depicted, structure 406 takes the form of an I-beam of electrically-insulative material. In some illustrative examples, structure 406 is inspected after being joined to other components. In some of these illustrative examples, surfaces other than first surface 404 may be undesirably difficult to access for non-destructive inspection due to being joined to other structures. Eddy current system 402 is configured to perform a non-destructive inspection of structure 406 by only accessing a single surface.

Eddy current system 402 includes magnetic field source 408 and magnetic sensor 410. As depicted, ion beam 412 enters structure 406 at first surface 404. As depicted, magnetic field source 408 and magnetic sensor 410 face the same surface that ion beam 412 enters, first surface 404.

Magnetic field source 408 applies magnetic field 414. Magnetic sensor 410 senses at least one magnetic attribute indicative of eddy currents within structure 406.

Figure 5:
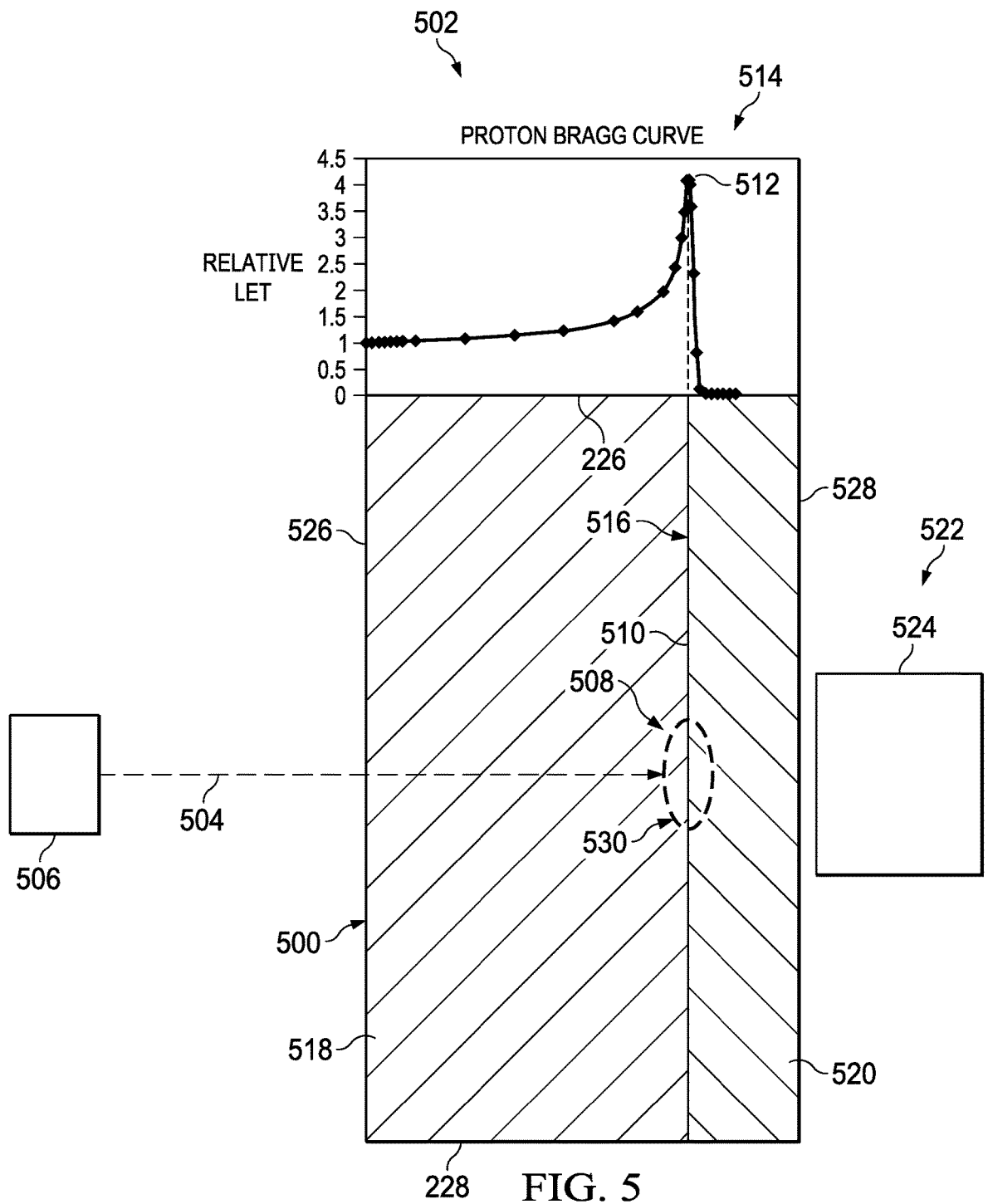
FIG. 5 is an illustration of a cross-sectional view of a structure during welding in accordance with an illustrative embodiment.

Turning now to FIG. 5, an illustration of a cross-sectional view of a structure during welding is depicted in accordance with an illustrative embodiment. Structure 500 is present in manufacturing environment 502. Structure 500 is formed of an electrically-insulative material. Structure 500 is a physical implementation of structure 104 of FIG. 1.

Ion beam 504 is sent by ion beam source 506 into structure 500. By sending ion beam 504 into structure 500, conductive region 508 is formed in structure 500 at depth 510. Depth 510 corresponds to Bragg peak 512 of ion beam 504.

Graph 514 with Bragg peak 512 is presented to demonstrate the energy loss of ion beam 504 as it travels through structure 500. Bragg peak 512 occurs immediately prior to ions of ion beam 504 coming to rest. Bragg peak 512 occurs immediately prior to depth 510.

A kinetic energy of the ions in ion beam 504 is controlled to adjust depth 510 of conductive region 508. As depicted, depth 510 is configured to be at intersection 516 of first portion 518 and second portion 520. By configuring ion beam 504 to form conductive region 508 at intersection 516, heat is deposited at intersection 516. Heating intersection 516 forms a joint between first portion 518 and second portion 520.

The kinetic energy is controlled by adjusting ion beam source 506 or inserting attenuators (not depicted) between ion beam source 506 and structure 500. Eddy current system 522 includes ion beam source 506 and magnetic field source 524. Eddy current system 522 is a physical implementation of eddy current system 102 of FIG. 1. Components of eddy current system 522 can be positioned in any desirable location relative to structure 500. As depicted, ion beam 504 is sent into first surface 526 of structure 500. As depicted, magnetic field source 524 is positioned relative to second surface 528 of structure 500. In some other non-depicted examples, ion beam source 506 and magnetic field source 524 are associated with a same surface.

As depicted, first surface 526 and second surface 528 are substantially parallel to each other. However, in some illustrative examples, ion beam source 506 and magnetic field source 524 are associated with surfaces that are not parallel to each other.

Ion beam source 506 fires a pulse of mono-energetic ions, ion beam 504. Ion beam 504 enters structure 500 and deposits most of its energy at depth 510. This energy creates a large population of electron-hole pairs in a small volume, volume 530.

While electron-hole pairs are present in volume 530 at depth 510, magnetic field source 524 applies a varying magnetic field (not depicted). The varying magnetic field induces an eddy current (not depicted) in volume 530.

The eddy current causes Joule heating and a change in the magnetic field. In this illustrative example, the Joule heating is used to join first portion 518 and second portion 520. In some illustrative examples, ion beams are repeatedly sent into structure 500 to generate sufficient heat to weld first portion 518 and second portion 520. In some illustrative examples, conductive regions are generated at depth 510. In some illustrative examples, conductive regions are generated on either side of intersection 516 to heat surfaces of first portion 518 and second portion 520.

Figure 6:
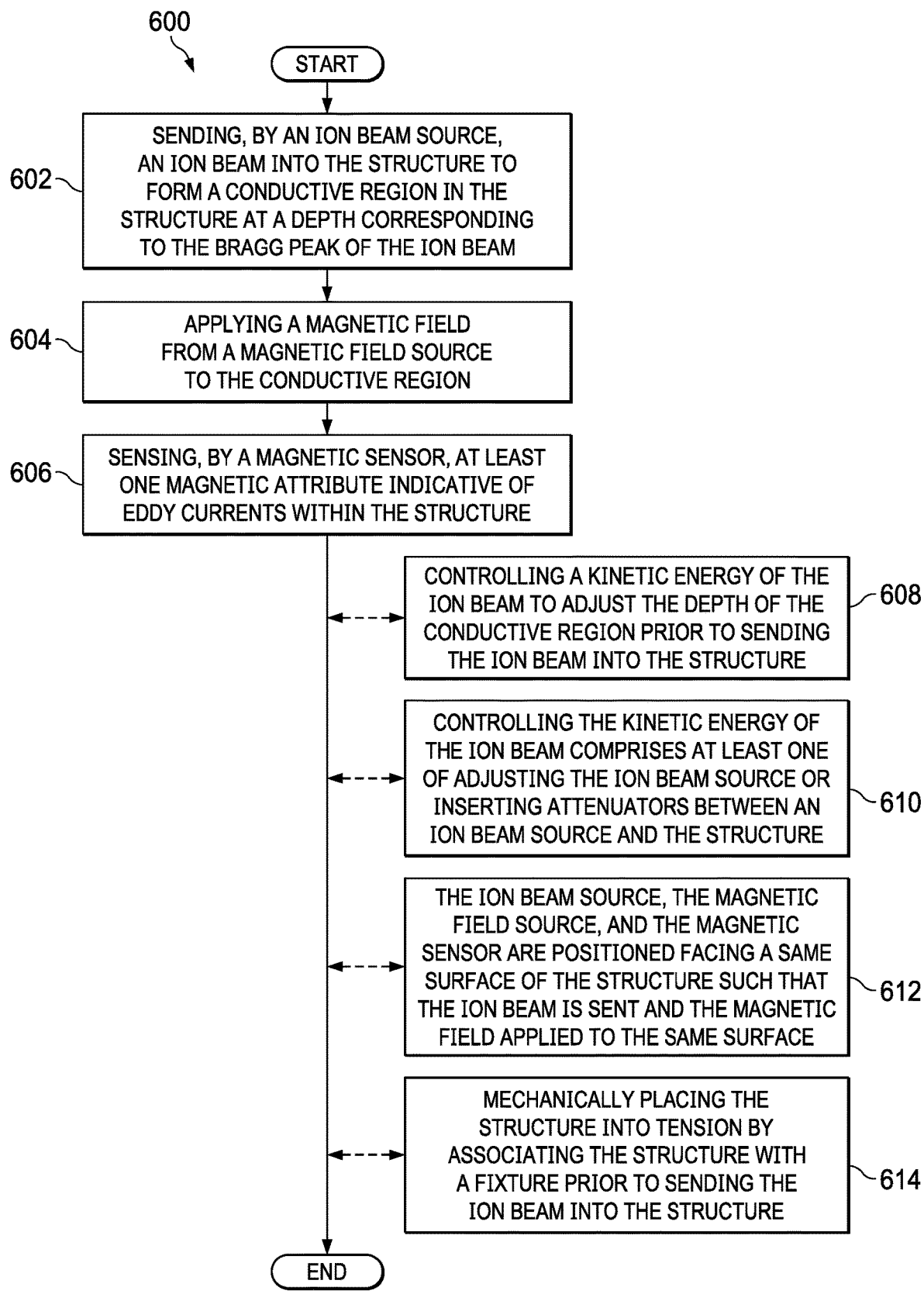
FIG. 6 is an illustration of a flowchart of a method of inductively inspecting a structure formed of an electrically-insulative material in accordance with an illustrative embodiment.

Turning now to FIG. 6, an illustration of a flowchart of a method of inductively inspecting a structure formed of an electrically-insulative material is depicted in accordance with an illustrative embodiment. Method 600 may be performed using eddy current system 102 of FIG. 1. Method 600 may be performed using eddy current system 216 of FIG. 2. In some illustrative examples, method 600 is performed using fixture 302 of FIG. 3. Method 600 may be performed to inspect structure 406 of FIG. 4. Method 600 may be performed using eddy current system 402 of FIG. 4.

Method 600 sends, by an ion beam source, an ion beam into the structure to form a conductive region in the structure at a depth corresponding to a Bragg peak of the ion beam (operation 602). Method 600 applies a magnetic field from a magnetic field source to the conductive region (operation 604). Applying the magnetic field to the conductive region generates eddy currents in the structure. The eddy current causes Joule heating and a change in the magnetic field.

Method 600 senses, by a magnetic sensor, at least one magnetic attribute indicative of eddy currents within the structure (operation 606). The magnetic sensor senses changes in the magnetic field. In some illustrative examples, the magnetic sensor measures a change in phase or frequency of the magnetic field. Afterwards, method 600 terminates.

Method 600 controls a kinetic energy of ions in the ion beam to adjust the depth of the conductive region prior to said sending the ion beam into the structure (operation 608). In some illustrative examples, said controlling the kinetic energy of the ions in the ion beam comprises at least one of adjusting the ion beam source or inserting attenuators between an ion beam source and the structure (operation 610).

In some illustrative examples, the ion beam source, magnetic field source, and the magnetic sensor are positioned facing a same surface of the structure such that the ion beam is sent and the magnetic field is applied to the same surface (operation 612).

In some illustrative examples, the structure is held by a fixture to position the structure in the path of the ion beam. In some illustrative examples, method 600 mechanically places the structure into tension by associating the structure with a fixture prior to said sending the ion beam into the structure (operation 614).

Figure 7:
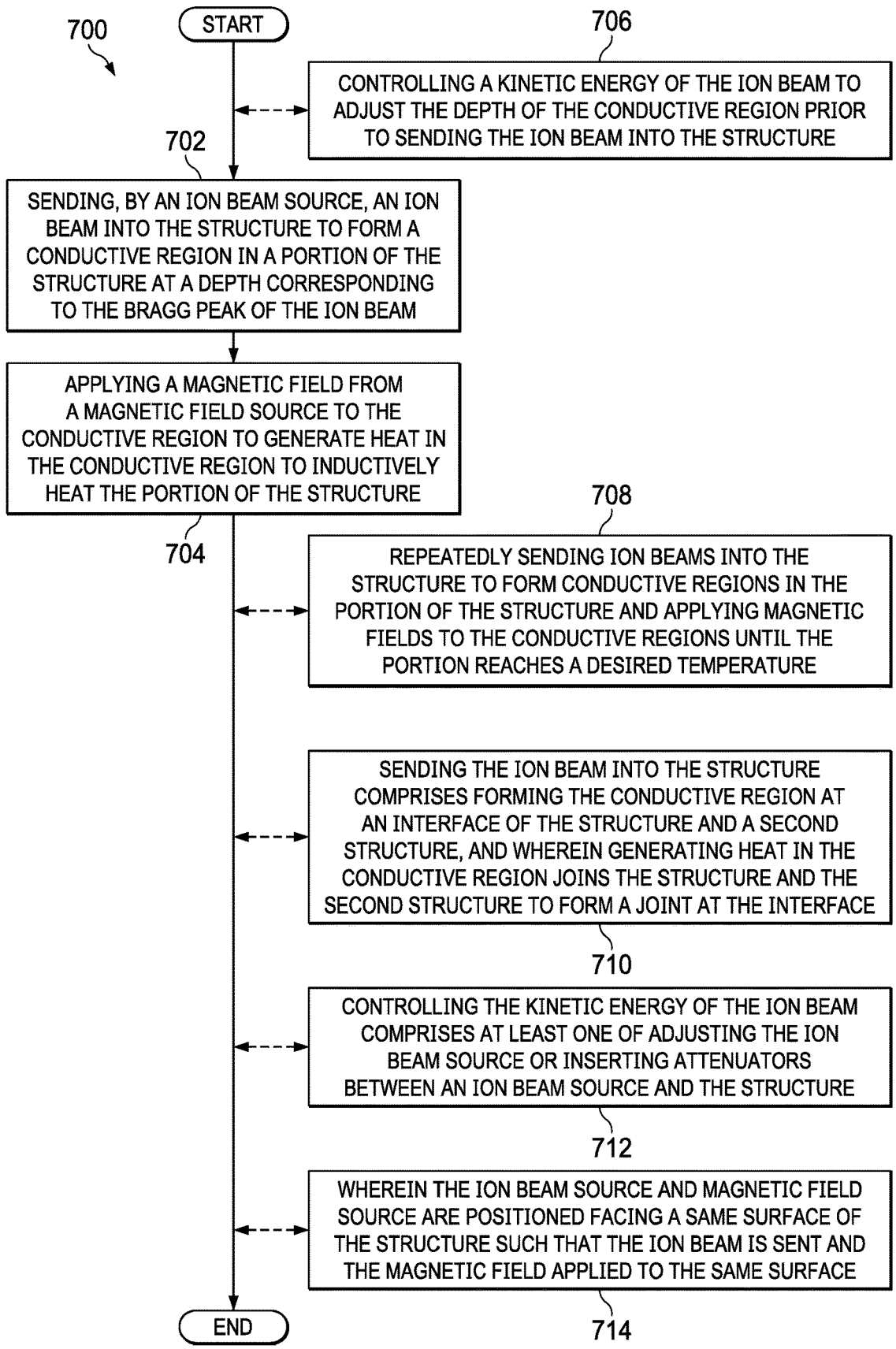
FIG. 7 is an illustration of a flowchart of a method of inductively heating a volume of an electrically-insulative structure in accordance with an illustrative embodiment.

Turning now to FIG. 7, an illustration of a flowchart of a method of inductively heating a volume of an electrically-insulative structure is depicted in accordance with an illustrative embodiment. Method 700 may be performed using eddy current system 102 of FIG. 1. Method 700 may be performed to heat treat structure 104 of FIG. 1. Method 700 may be performed to form joint 134 in structure 104 of FIG. 1. Method 700 may be performed using eddy current system 522 of FIG. 5. In some illustrative examples, method 700 may be performed to using eddy current system 216 of FIG. 2.

Method 700 sends, by an ion beam source, an ion beam into the structure to form a conductive region in a volume of the structure at a depth corresponding to a Bragg peak of the ion beam (operation 702). Method 700 applies a magnetic field from a magnetic field source to the conductive region to inductively heat the volume of the structure (operation 704). Afterwards, method 700 terminates.

Method 700 controls a kinetic energy of ions in the ion beam to adjust the depth of the conductive region prior to said sending the ion beam into the structure (operation 706). Controlling the kinetic energy of the ions can be performed in any desirable method. In some illustrative examples, said controlling the kinetic energy of the ions in the ion beam comprises at least one of adjusting the ion beam source or inserting attenuators between an ion beam source and the structure (operation 712).

In some illustrative examples, method 700 repeatedly sends ion beams into the structure to form conductive regions in the volume of the structure and applying magnetic fields to the conductive regions until the volume reaches a desired temperature (operation 708). By repeatedly sending ion beams into the structure, the volume is gradually brought to the desired temperature.

In some illustrative examples, said sending the ion beam into the structure comprises forming the conductive region at an interface of the structure and a second structure, and wherein said inductively heating joins the structure and the second structure to form a joint at the interface (operation 710).

To perform method 700, the ion beam source and the magnetic field source may be positioned at any desirable location relative to the structure. In some illustrative examples, the ion beam source and the magnetic field source are positioned facing a same surface of the structure such that the ion beam is sent and the magnetic field is applied to the same surface (operation 714). In some illustrative examples, the ion beam source and the magnetic field source are positioned facing different surfaces. In some illustrative examples, the ion beam source and the magnetic field source are positioned such that the ion beam source and the magnetic field source are facing surfaces opposite a joint.

As used herein, the phrase "at least one of," when used with a list of items, means different combinations of one or more of the listed items may be used and only one of each item in the list may be needed. For example, "at least one of item A, item B, or item C" may include, without limitation, item A, item A and item B, or item B. This example also may include item A, item B, and item C or item B and item C. Of course, any combinations of these items may be present. In other examples, "at least one of" may be, for example, without limitation, two of item A; one of item B; and ten of item C; four of item B and seven of item C; or other suitable combinations. The item may be a particular object, thing, or a category. In other words, at least one of means any combination items and number of items may be used from the list but not all of the items in the list are required.

As used herein, "a number of," when used with reference to items means one or more items.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram. Some blocks may be optional. For example, some operations of operation 608 thorough operation 614 may be optional. As another example, some operations of operation 706 through operation 714 may be optional.

Figure 8:
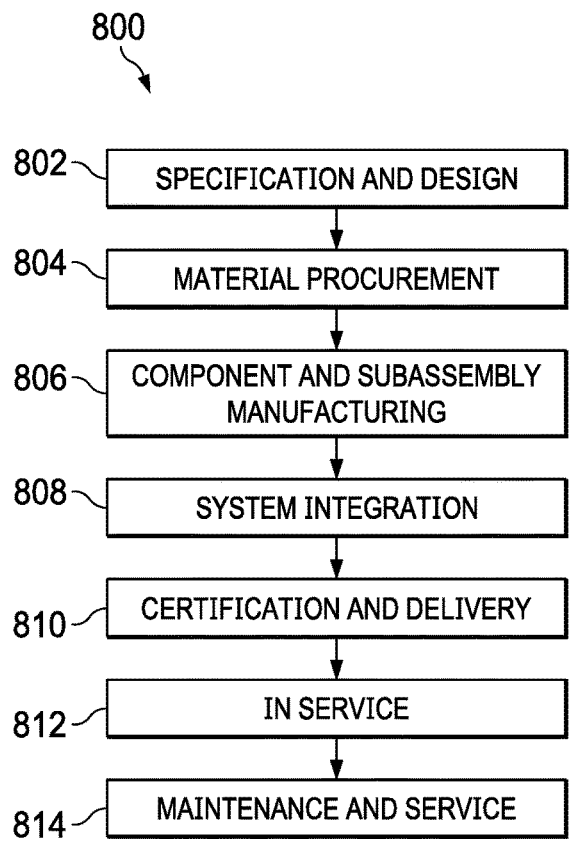
FIG. 8 is an illustration of an aircraft manufacturing and service method in a form of a block diagram in accordance with an illustrative embodiment.
Figure 9:
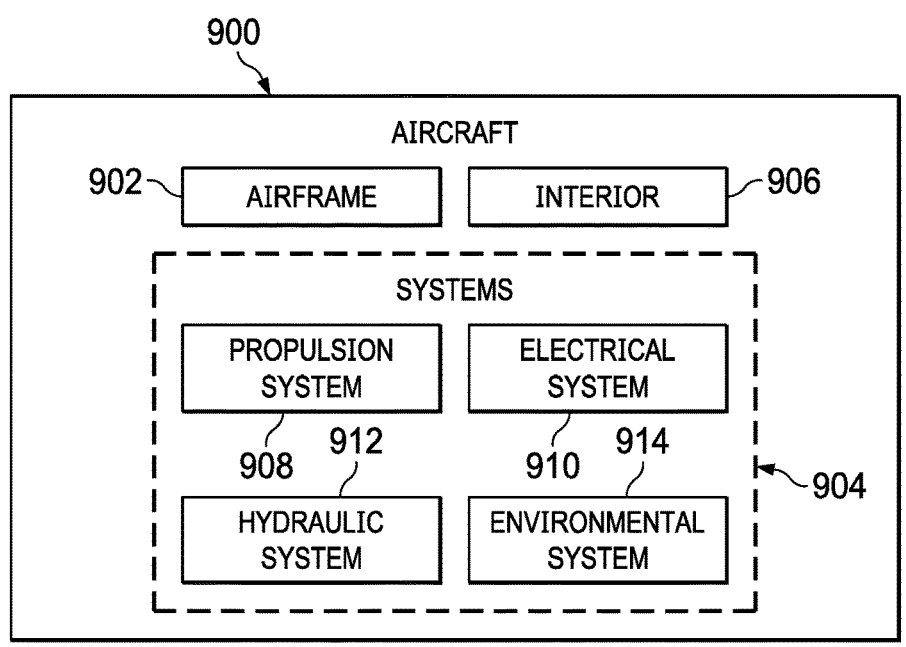
FIG. 9 is an illustration of an aircraft in a form of a block diagram in which an illustrative embodiment may be implemented.

Illustrative embodiments of the present disclosure may be described in the context of aircraft manufacturing and service method 800 as shown in FIG. 8 and aircraft 900 as shown in FIG. 9. Turning first to FIG. 8, an illustration of an aircraft manufacturing and service method is depicted in accordance with an illustrative embodiment. During pre-production, aircraft manufacturing and service method 800 may include specification and design 802 of aircraft 900 in FIG. 9 and material procurement 804.

During production, component and subassembly manufacturing 806 and system integration 808 of aircraft 900 takes place. Thereafter, aircraft 900 may go through certification and delivery 810 in order to be placed in service 812. While in service 812 by a customer, aircraft 900 is scheduled for routine maintenance and service 814, which may include modification, reconfiguration, refurbishment, or other maintenance and service.

Each of the processes of aircraft manufacturing and service method 800 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 9, an illustration of an aircraft is depicted in which an illustrative embodiment may be implemented. In this example, aircraft 900 is produced by aircraft manufacturing and service method 800 of FIG. 8 and may include airframe 902 with plurality of systems 904 and interior 906. Examples of systems 904 include one or more of propulsion system 908, electrical system 910, hydraulic system 912, and environmental system 914. Any number of other systems may be included.

Apparatuses and methods embodied herein may be employed during at least one of the stages of aircraft manufacturing and service method 800. One or more illustrative embodiments may be manufactured or used during at least one of component and subassembly manufacturing 806, system integration 808, in service 812, or maintenance and service 814 of FIG. 8. For example, inspection of structure 104 using eddy current system 102 may be performed during component and subassembly manufacturing 806. As another example, heat treatment or joining of structure 104 using eddy current system 102 may be performed during component and subassembly manufacturing 806. In some illustrative examples, inspection of eddy current system 102 using eddy current system 102 is performed during maintenance and service 812. As an example, method 600 or method 700 may be used during component and subassembly manufacturing 806 to perform one of heat treatment, joining, or inspection of structure 104. Structure 104 may be a component of aircraft 900 such as a component of airframe 902 or interior 906.

The illustrative examples present an eddy current system configured to perform at least one of heat treatment, joining, or non-destructive inspection of a structure. The eddy current system performs the operation on a structure to be inspected, bonded/welded, or heat treated.

The eddy current system comprises a magnetic field source with variable output intensity or orientation and an ion beam source, such as a cyclotron or van de Graff generator. In some illustrative examples, the eddy current system includes a fixture to hold the structure in the ion beam. The fixture may also hold attenuators. When present, the fixture is non-conductive and not ferromagnetic. In some illustrative examples, the eddy current system includes a means to control the energy of ions entering the object, such as attenuators.

The illustrative examples place the structure in a fixture and orients the structure so a desired part of the structure is in the beam path. In some illustrative examples, the fixture automatically orients the structure and applies the sensors.

The magnetic field source is positioned near the object. The kinetic energy of the ions is selected. The kinetic energy may be adjusted by adjusting the ion beam source or by inserting attenuators of selected thickness between the beam source and the object.

The ion beam source fires a pulse of mono-energetic ions, for example protons. The ion beam (pulse) enters the structure and deposits most of its energy at a specific depth called the Bragg peak. The energy creates a large population of electron-hole pairs in a small volume.

Before too many electron-hole pairs recombine, the magnetic field source applies a varying magnetic field. The varying magnetic field induces an eddy current in the small volume. The eddy current causes Joule heating and a change in the magnetic field.

When the eddy current system is used in a bonding or heat-treating application, the heating is the desired result. If the eddy current system is used in a sensing application, a sensor measures changes in the magnetic field. The measurement is sometimes indirect, such as a change in phase or frequency of the field source. If the change in the magnetic field is weaker than it would be for a structure of the same type having a desired quality, this is evidence of out of tolerance inconsistencies. For example, if the change in the magnetic field is weaker than it would be for a structure of the same type having a desired quality, this is evidence of cracks, voids, or unbonded areas that block the eddy currents, as in traditional ECT. Varying the ion energy allows the conductive small volume to be created at selected depths.

The illustrative examples provide the benefits of eddy current inspection for non-conductive materials. The illustrative examples give the benefits of induction welding for non-conductive materials without use of susceptors. Providing for induction welding without susceptors avoids a reduction in structural integrity or aesthetic qualities that susceptors may cause. The illustrative examples can be used to repair materials for which susceptors were not built in.

Compared to traditional eddy current inspection, the illustrative examples allow inspection for cracks, voids, or delaminations deep within a structure, rather than only near the surface. Compared to traditional induction welding, the illustrative examples allow heating deep within a structure, rather than only near the surface.

With the "chirping" option, the illustrative examples make the two sides of a joint pull toward each other during induction welding or brazing. This reduces force that must be applied from the outside of the structure, which could potentially undesirably affect the structure or its appearance. Application of a pulling force may result in a void-free bond.

The illustrative examples use a pulse of ions and the corresponding sharp deposition of energy at the Bragg peak to create a temporarily conductive volume of material at a precise location inside a nonconductive structure. The illustrative examples then induce eddy currents in the temporary conductive volume.

The conductive volume has no value on its own, and applying a variable magnetic field to a nonconductive object produces no eddy currents. The combination of the conductive volume and the variable magnetic field in the illustrative examples provide the advantages to inspection or processing operations.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method of inductively inspecting a structure formed of an electrically-insulative material, the method comprising:
   sending, by an ion beam source positioned relative to a surface of the structure, an ion beam into the structure to form a conductive region in the structure at a depth corresponding to a Bragg peak of the ion beam;
   applying a magnetic field from a magnetic field source to the conductive region to induce eddy currents in the structure, wherein the magnetic field source is positioned relative to the surface of the structure or another surface of the structure; and
   sensing, by a magnetic sensor, at least one magnetic attribute indicative of the eddy currents within the structure.

2. The method of claim 1, further comprising:
   controlling a kinetic energy of ions in the ion beam to adjust the depth of the conductive region prior to said sending the ion beam into the structure.

3. The method of claim 2, wherein said controlling the kinetic energy of the ions in the ion beam comprises at least one of adjusting the ion beam source or inserting attenuators between the ion beam source and the structure.

4. The method of claim 1, wherein the ion beam source, the magnetic field source, and the magnetic sensor are positioned facing a same surface of the structure such that the ion beam is sent and the magnetic field is applied to the same surface.

5. The method of claim 1, further comprising:
   mechanically placing the structure into tension by holding the structure with a fixture prior to said sending the ion beam into the structure.

6. A method of inductively heating a volume of an electrically-insulative structure, the method comprising:
   sending, by an ion beam source positioned relative to a surface of the structure, an ion beam into the structure to form a conductive region in a volume of the structure at a depth corresponding to a Bragg peak of the ion beam; and
   applying a magnetic field from a magnetic field source to the conductive region to induce eddy currents in the structure and to inductively heat the volume of the structure, wherein the magnetic field source is positioned relative to the surface of the structure or another surface of the structure.

7. The method of claim 6, wherein said sending the ion beam into the structure comprises forming the conductive region at an interface of the structure and a second structure, and wherein said inductively heating joins the structure and the second structure to form a joint at the interface.

8. The method of claim 6, further comprising:
repeatedly sending ion beams into the structure to thereby form conductive regions in the volume of the structure and applying magnetic fields to the conductive regions until the volume reaches a desired temperature.

9. The method of claim 6, further comprising:
controlling a kinetic energy of ions in the ion beam to adjust the depth of the conductive region prior to said sending the ion beam into the structure.

10. The method of claim 9, wherein said controlling the kinetic energy of the ions in the ion beam comprises at least one of adjusting the ion beam source or inserting attenuators between the ion beam source and the structure.

11. The method of claim 6, wherein the ion beam source and the magnetic field source are positioned facing a same surface of the structure such that the ion beam is sent and the magnetic field is applied to the same surface.

12. An eddy current system for inspection or heating of a structure formed of an electrically-insulative material, the eddy current system comprising:
an ion beam source positioned relative to a surface of the structure and configured to generate an ion beam that is sent into the structure at a depth corresponding to a Bragg peak of the ion beam, wherein the ion beam forms a conductive region at the depth; and
a magnetic field source positioned relative to the surface of the structure or another surface of the structure, wherein the magnetic field source includes at least one of variable output intensity or variable output orientation, and wherein the magnetic field source is configured to generate a magnetic field to be applied to the conductive region to induce eddy currents in the structure.

13. The eddy current system of claim 12, further comprising:
a magnetic sensor positioned relative to the surface of the structure or another surface of the structure, wherein the magnetic sensor is configured to sense at least one magnetic attribute indicative of the eddy currents in the structure.

14. The eddy current system of claim 13, wherein the magnetic sensor is positioned within a center of a coil of the magnetic field source.

15. The eddy current system of claim 13, wherein the ion beam source, the magnetic field source, and the magnetic sensor are connected to an end effector.

16. The eddy current system of claim 12, wherein the ion beam source and the magnetic field source are directed in a same direction.

17. The eddy current system of claim 12, further comprising:
a beam-steering system positioned between the ion beam source and the structure, wherein the beam-steering system is configured to change a shape of the ion beam generated by the ion beam source.

18. The eddy current system of claim 12, wherein the ion beam source is one of a cyclotron, a van de Graff generator, or a linear accelerator.

19. The eddy current system of claim 12, further comprising:
attenuators positioned between the ion beam source and the structure.

20. The eddy current system of claim 12, wherein the structure is placed in a fixture, and wherein the fixture is configured to hold the structure in the ion beam and stretch the structure in order to place the structure into tension.

* * * * *

UNITED STATES PATENT AND TRADEMARK OFFICE
CERTIFICATE OF CORRECTION

| | |
|---|---|
| PATENT NO. | : 11,320,476 B2 |
| APPLICATION NO. | : 16/512134 |
| DATED | : May 3, 2022 |
| INVENTOR(S) | : Brian Jay Tillotson |

It is certified that error appears in the above-identified patent and that said Letters Patent is hereby corrected as shown below:

In the Claims

Column 14, Line 61, correct "surface of the structure, an ion beam into the structure" to read -- surface of the electrically-insulative structure, an ion beam into the electrically-insulative structure --,
Column 14, Line 62, correct "a volume" to read -- the volume --,
Column 14, Line 62, correct "the structure" to read -- the electrically-insulative structure --,
Column 14, Line 67, correct "structure" to read -- electrically-insulative structure --,
Column 15, Line 1, correct "structure" to read -- electrically-insulative structure --,
Column 15, Line 2, correct "the structure" to read -- the electrically-insulative structure --,
Column 15, Line 3, correct "the structure" to read -- the electrically-insulative structure --,
Column 15, Line 5, correct "the structure" to read -- the electrically-insulative structure --,
Column 15, Line 6, correct "the structure" to read -- the electrically-insulative structure --,
Column 15, Line 7, correct "the structure" to read -- the electrically-insulative structure --,
Column 15, Line 10, correct "the structure" to read -- the electrically-insulative structure --,
Column 15, Line 11, correct "the structure" to read -- the electrically-insulative structure --,
Column 15, Line 17, correct "the structure" to read -- the electrically-insulative structure --,
Column 15, Line 21, correct "the structure" to read -- the electrically-insulative structure --,
Column 15, Line 24, correct "the structure" to read -- the electrically-insulative structure --.

Signed and Sealed this
Twenty-third Day of August, 2022

Katherine Kelly Vidal
*Director of the United States Patent and Trademark Office*